(12) United States Patent
Hidaka

(10) Patent No.: US 6,291,873 B1
(45) Date of Patent: Sep. 18, 2001

(54) SEMICONDUCTOR DEVICE HAVING A RESISTIVE ELEMENT CONNECTED TO A TRANSISTOR AND SUBSTRATE

(75) Inventor: Hajime Hidaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/477,818

(22) Filed: Jan. 5, 2000

(30) Foreign Application Priority Data

Apr. 9, 1999 (JP) .................................................. 11-102604

(51) Int. Cl.[7] .......................... H01L 29/00; H01L 27/102; H01L 29/70; H01L 31/11
(52) U.S. Cl. .......................... 257/539; 257/538; 257/577
(58) Field of Search ...................... 257/536, 537, 257/538, 539, 540, 541, 542, 543, 577

(56) References Cited

U.S. PATENT DOCUMENTS

| | | | |
|---|---|---|---|
| 4,258,311 | * | 3/1981 | Tokuda et al. . |
| 5,466,959 | * | 11/1995 | Goerlach et al. ...................... 257/361 |
| 5,883,417 | * | 3/1999 | Jao et al. ............................... 257/377 |
| 5,955,774 | * | 9/1999 | Kang ...................................... 257/533 |
| 5,977,598 | * | 11/1999 | Chen et al. ........................... 257/380 |
| 5,990,539 | * | 11/1999 | Conzelmann et al. ................ 257/577 |

* cited by examiner

*Primary Examiner*—Ngân V. Ngô
(74) *Attorney, Agent, or Firm*—Jones Volentine, PLLC

(57) ABSTRACT

In a semiconductor device comprising a resistance element electrically connected to a bipolar transistor, the bipolar transistor is formed on a silicon substrate and a predetermined resistance element is formed on an insulation film formed on the bipolar transistor based on results of measurements monitored for this transistor, in such a manner that the semiconductor device has prescribed characteristics.

23 Claims, 4 Drawing Sheets

SEMICONDUCTOR DEVICE HAVING A RESISTIVE ELEMENT CONNECTED TO A TRANSISTOR AND SUBSTRATE

BACKGROUND OF THE INVENTION

Semiconductor devices constructed using bipolar transistors are inclined to have their base widths formed as thinly as possible in order to achieve high speeds.

FIG. 5 shows a related method of manufacturing a semiconductor device having a bipolar transistor. An embedded n+ layer 12 and an n-epitaxial growth layer 14 are formed on a p-type silicon substrate 10 taken as a semiconductor substrate. A trench element separation insulation film 16 and a field insulation film 18 are formed on the p-type silicon substrate 10. A silicon oxide film 11 is formed on the region forming the trench element separation insulation film 16, the field insulation film 18 and a bipolar transistor and a surface of the p-type silicon substrate 10 is then flattened. A contact hole is then formed at the silicon oxide film 11 on the n-type epitaxial growth layer. A polysilicon film is then formed on the entire surface of the p-type silicon substrate 10 using CVD (Chemical Vapor Deposition) techniques. Predetermined patterns can then be formed from the polysilicon film by subjecting the polysilicon film to photolithographic and etching. After this, impurities are injected into the p-type silicon substrate 10 in the following manner. An n-type impurity is injected into the polysilicon pattern connected to the n-epitaxial growth layer 14. A p-type impurity is then injected at a polysilicon pattern constituting a base lead-out electrode. A prescribed impurity is then injected into a polysilicon pattern constituting a resistance element. The p-type silicon substrate 10 is then heated to a temperature of 900 to 1000° C. A collector n+ layer 20 diffused with n-type impurity is then formed at the n-epitaxial growth layer 14 as a result of this heat treatment. Similarly, a base lead-out electrode 26 and a resistance element 24 having a prescribed resistance value are formed at the silicon oxide film 11 as a result of this heat treatment. This situation is shown in FIG. 5(a).

Next, a silicon oxide film 28 is formed as an insulation film at the surface of the p-type silicon substrate 10. After this, an opening is formed at a prescribed region of the base lead-out electrode 26 using photolithographic and etching processes. Next, a silicon nitride film 30 is formed as an insulation film at the silicon oxide film 28 including the opening. A silicon nitride film side wall is then formed within the opening by etching. The silicon oxide film 11 is then removed from within the opening and a p-type epitaxial layer is formed at the p-type silicon substrate 10. This p-type silicon substrate 10 is then the base p layer 32. This situation is shown in FIG. 5(b).

A polysilicon film including an n-type conductive impurity that becomes an emitter lead-out electrode 36 to be described later is formed on the surface of the silicon nitride film 30. Next, an emitter n+ layer 34 is formed at the p-type silicon substrate 10 using heat treatment. An emitter lead-out electrode 36 is then formed on the p-type silicon substrate 10 using photolithographic and etching processing, so that an npn transistor is formed as a result of the above processes. This situation is shown in FIG. 5(c).

After this, a protective pattern is formed for the silicon oxide film 38a on the resistance element 24. Next, polysilicon film not covered by the polysilicon oxide film 38a is injected with impurity ions. This ion injection is carried out in order to lower the resistance of contacts connecting interconnect formed afterwards and the resistance element. A silicon oxide film 42 is then formed on the surface of the p-type silicon substrate 10 as an insulation film. Next, a contact hole is formed at the silicon oxide film 42 using photolithographic and etching processing. This contact hole is used for electrically connecting the base lead-out electrode 26 emitter lead-out electrode 36, collector lead-out electrode 22 and resistance element 24 to interconnect formed afterwards. An interconnect plug 44 is then formed by burying the contact hole thus formed with a high fusion point metal such as tungsten. An aluminum alloy film constituting an interconnect film is then formed on the silicon oxide film 42 including the interconnect plug 44. Interconnect 46 is then formed by patterning this aluminum alloy film. After this, an insulation film 48 is formed as a protective film on the silicon oxide film 42 including the interconnect 46. This situation is shown in FIG. 5(d).

The width of the base film can therefore be made thin by controlling the thickness of the base p layer 32 and the diffusion of the emitter n+ film 34 in this manner.

However, in the aforementioned semiconductor device manufacturing method there is the fear that the width of the base layer will be formed in an uneven manner due to the p-type epitaxial layer being formed in a thin manner in order to increase speed. This kind of unevenness in the base layer width dramatically influences the amplification factor of the bipolar transistor. In order to suppress this influence, the value of the resistance element 24 required in bias regulation is adjusted in line with the amplification factor of the transistor. As a method of adjustment, there is provided a method where the resistance value of the resistance element 24 is adjusted using the position of a contact for connecting with the resistance element 24. This adjustment of the contact position is carried out by modifying the mask. However, in this method it is necessary to prepare a new mask for adjustment, and the range of adjustment of the resistance value is narrow. Further, the resistance element pattern is formed long beforehand in order to broaden the degree of freedom of setting the position of contact. Parasitic capacitance occurring between the resistance element pattern and the p-type silicon substrate 10 therefore increase and interconnect delays become more substantial.

SUMMARY OF THE INVENTION

The structure of the semiconductor device of the present invention comprises a circuit element formed on a semiconductor substrate and a resistance element, electrically connected to the circuit element and being formed on an inter-layer insulation film covering said circuit element.

Further, the resistance value of the resistance element can be set according to the characteristics of the circuit element.

In the present invention, the circuit element can be a bipolar transistor and bias regulation of the bipolar transistor can be carried out by the resistance element.

On the other hand, the method of manufacturing the semiconductor device of the present invention comprises the steps of: forming a circuit element on a semiconductor substrate; forming a first insulation film covering the circuit element; forming a contact hole for connecting with an electrode of the circuit element in a first insulation film; forming an interconnect plug within the contact hole and a prescribed interconnect pattern on the first insulation film using a high fusion point metal film; forming a second insulation film covering the interconnect pattern; forming an opening in the second insulation film in such a manner that part of the interconnect pattern and part of the upper surface of the first insulation film are exposed; and forming a polysilicon film of a prescribed conductive impurity concentration and film thickness covering and extending over part of the interconnect pattern and part of the top surface of the first insulation film.

The polysilicon film can be formed using CVD techniques in such a manner as to control the film thickness and the impurity concentration of the polysilicon film.

In the present invention, the film thickness of the polysilicon film and the impurity concentration can be set based on the results of measurements taken of the characteristics of the circuit element prior to forming the polysilicon film.

The polysilicon film can therefore be formed using CVD techniques in such a manner as to control the film thickness and the impurity concentration of the polysilicon film.

In the present invention, the film thickness and the impurity concentration of the polysilicon film can be set based on the results of measurements taken of the characteristics of the circuit element prior to forming the polysilicon film.

DETAILED DESCRIPTION OF THE PREFERRED EMBODIMENTS

Figure 6:
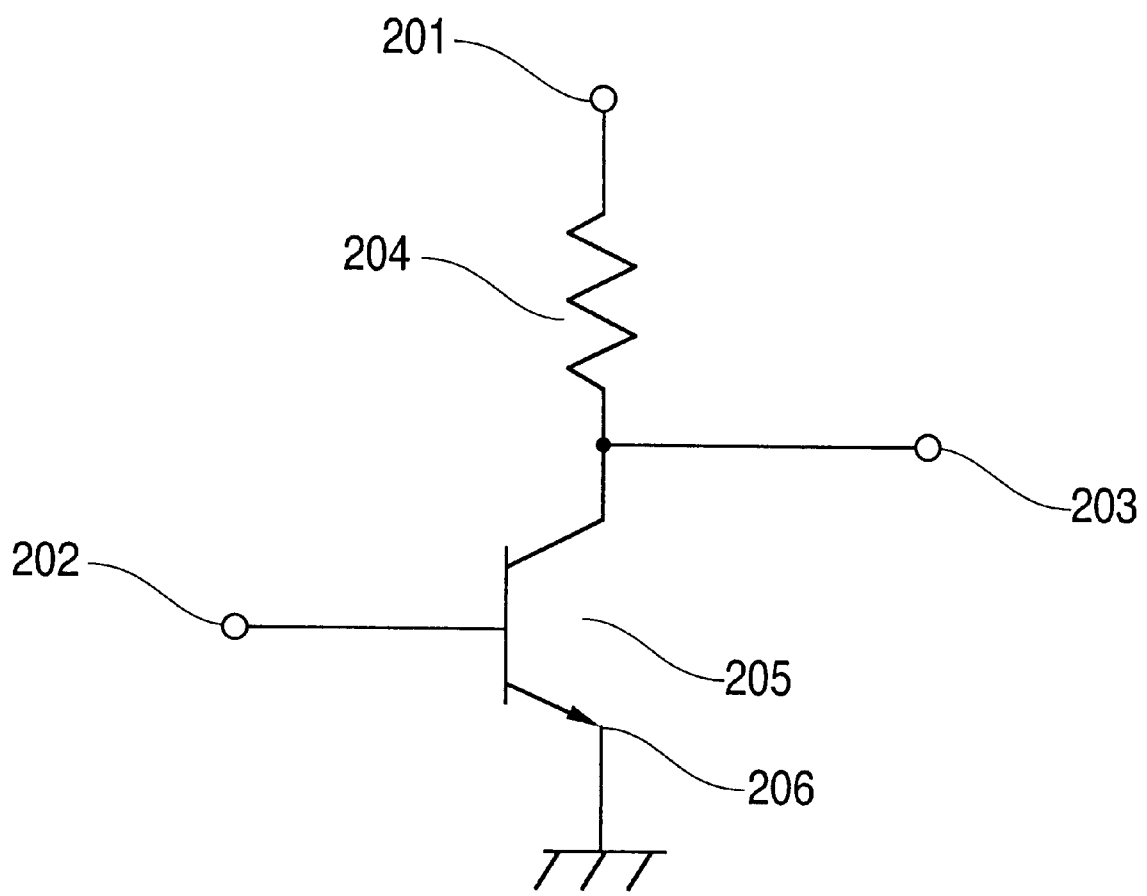
FIG. 6 is a circuit diagram of a basic circuit for configuring an example semiconductor device to which the first to fourth embodiments of the present invention are applied.

The following is a detailed description using the cross-sectional structural views of FIG. 1 to FIG. 4 of the embodiments of the present invention. A basic circuit taken as an example of a semiconductor circuit of the embodiments of the present invention is shown in FIG. 6. In FIG. 6, the collector of an npn bipolar transistor 205 that is the circuit element is connected to an output terminal 203. At the collector, a prescribed power supply voltage V is applied to a terminal 201 via a resistance element 204. The base of a bipolar transistor 205 is electrically connected to an input terminal 202 and an earth potential is applied to an emitter 206 of the bipolar transistor 205. With this circuit, when the input terminal 202 has a fixed range of variation, the current value (or voltage value) of the output terminal 203 is made to have a fixed range of variation. In order to fix the range of variation of the output terminal 203, setting and adjustment is carried out according to variations in the amplification factor of the bipolar transistor 205, i.e. the output of the output terminal 203 can be made small if the value of the resistance element 204 is made small. Further, the output of the output terminal 203 can be made large if the value of the resistance element 204 is made large.

Figure 1A:
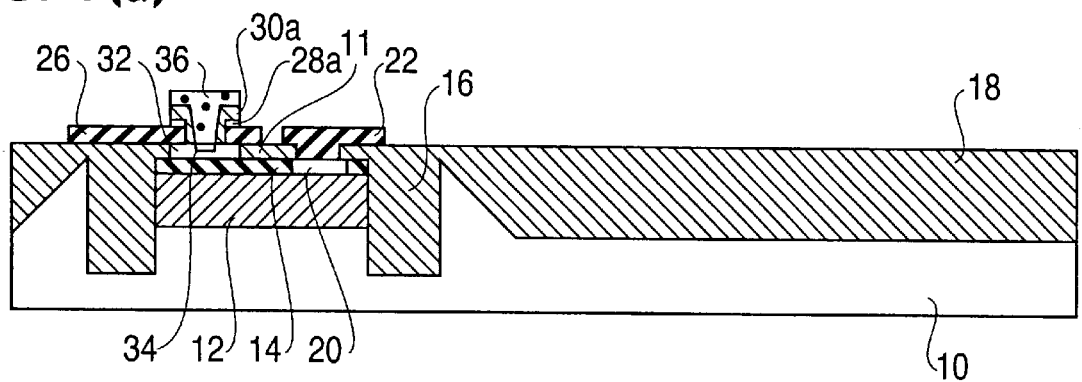
FIG. 1(a) through FIG. 1(c) are cross-sectional views showing the flow of a method for manufacturing a semiconductor device of a first embodiment of the present invention.
Figure 1B:
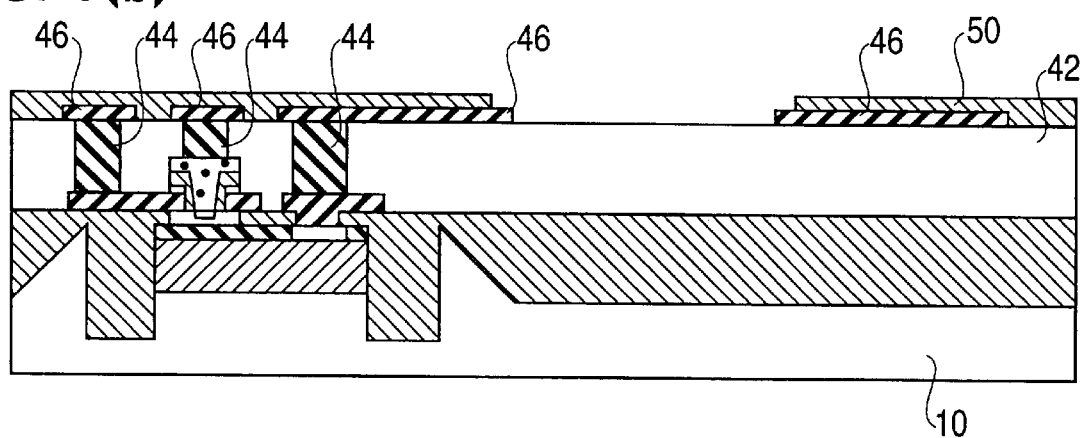

FIG. 1 is a cross-sectional structural view showing the flow of a method of manufacturing the semiconductor device of the first embodiment of the present invention. The following is a description of the method of manufacturing the semiconductor device of the first embodiment of the present invention.

First, a bipolar transistor that is the circuit element shown in the related art is formed on a p-type silicon substrate 10 that is the semiconductor substrate. This situation is shown in FIG. 1(a). The resistance element corresponding to the resistance element 24 of FIG. 5 is not formed in this step. Next, a silicon oxide film 42 that is the inter-layer insulation film is formed as the first insulation film on the bipolar transistor, the trench separation insulation film 16 and the field insulation film 18. A contact hole is then formed in the silicon oxide film 42 using photolithographic and etching processing. This contact hole is used for electrically connecting the base lead-out electrode 26 emitter lead-out electrode 36 and collector lead-out electrode 22 to interconnect formed afterwards. A high fusion point metal layer of tungsten etc. is then formed within the contact hole thus formed and on the silicon oxide film 42. An interconnect plug 44 and interconnect 46 are then formed using a high fusion point metal film by photolithographic and etching processing. A TEG (Test Element Group) for monitoring the characteristics of the bipolar transistor is then formed at regions such as gridlines etc. that do not constitute the element, while constituting the bipolar transistor. Pads for measurement use (not shown) connected to electrodes of the TEG are then formed in a step for forming the interconnect plug 44 and the interconnect 46. After this, characteristics of the bipolar transistor are measured using this TEG for monitoring use. A resistance of a resistance element 204 is then obtained according to these results so that the output 203 of the circuit in FIG. 6 becomes a prescribed current or voltage. The interconnect plug 44 and interconnect 46 can also be formed separately.

A silicon nitrate film 50 is then formed on the silicon oxide film 42 including the interconnect 46 as a second insulating film. Next, a prescribed opening is formed at the silicon nitride film 50 using photolithographic and etching processing in such a manner as to expose the upper surface of the silicon oxide film 42. This opening is the region where the resistance element is formed. Part of the interconnect 46 is also exposed while forming this opening so that the resistance element thus formed can be electrically connected to the interconnect 46. This situation is shown in FIG. 11(b). Next, a polysilicon film including a p-type impurity as a conductive impurity is formed on the opening on the silicon oxide film 42, the exposed part of the interconnect 46 and the on the silicon nitride film 50. This polysilicon film is formed by normal CVD techniques while introducing a gas including a chemical element comprising a p-type impurity such as diborane into a treatment chamber and activating the impurities at a temperature of approximately 700° C. This polysilicon film is formed in such a manner as to be of a prescribed sheet resistance corresponding to the resistance obtained previously by the TEG for monitor use. The obtaining of a prescribed sheet resistance is possible by exerting control to give a prescribed impurity concentration and film thickness during forming of the polysilicon film. In this embodiment, the impurity concentration and film thickness for obtaining a prescribed sheet resistance can be obtained in advance using the TEG for monitoring used in resistance element evaluation.

Figure 1C:
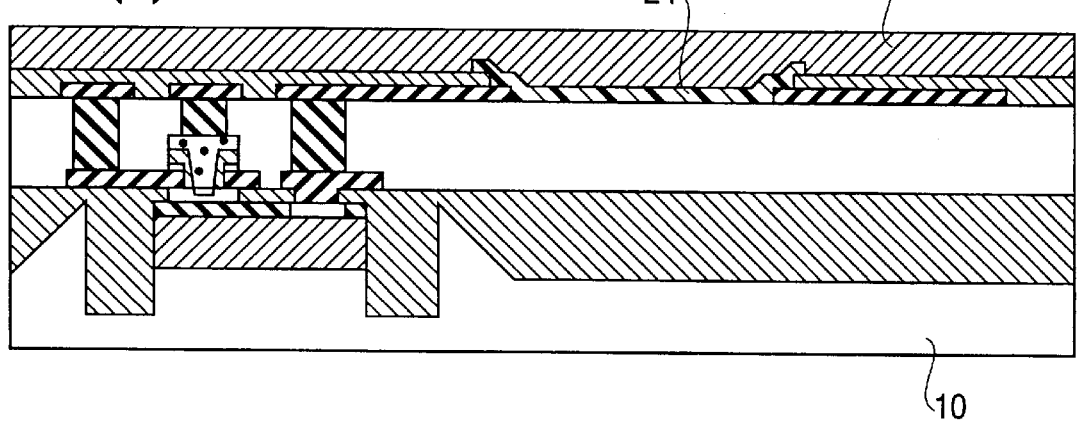

Next, the resistance element 24 of a prescribed pattern is formed by the polysilicon film using photolithographic and etching processing. An insulation film 48 is then formed as a protective film for providing resistance to moisture. This situation is shown in FIG. 1(c).

A detailed description will now be given of the method for setting the resistance. Generally, with a resistive body of length L, width W and film thickness (height) t, from parameters including a constant k decided by the film type and an impurity concentration N, the resistance R of this resistive body can be expressed by R=kL/tWN. The sheet resistance Rs of a polysilicon film is therefore Rs $t^{31}$ $^1N^{-1}$ and it can therefore be said that R Rs(L/W).

Of these parameters, the length L and the width W of the resistive body are decided according to the design and a mask is made in such a manner as to give a prescribed pattern. If the remaining parameters of film thickness t and impurity concentration N are then decided, a prescribed resistance R can be obtained. The sheet resistance Rs can therefore be controlled in the polysilicon film-forming step. The film thickness of the formed polysilicon film is relative to the treatment time and the borate concentration of the treatment atmosphere. A polysilicon film of a prescribed sheet resistance can therefore be formed by controlling the treatment time and borate concentration in the treatment atmosphere. Next, a resistance element of a prescribed resistance can be obtained by forming a resistive pattern of length L and width W using photolithographic and etching processing. It is also possible to fix one of either the film thickness or the impurity concentration, and then carry out control using the other.

According to the method of this embodiment, resistance elements can be formed using low temperature heat treatment at approximately 700° C., compared with the 900 to 1000° C. for forming a related resistance element. As a result, the resistance element 24 can be formed after forming the transistor and then confirming the characteristics. The interconnect 46 is formed of a high fusion point metal film and the aforementioned heat treatment therefore does not pose any problems. Parasitic capacitance between the resistance element 24 and the substrate 10 can therefore be reduced because the distance between the substrate 10 and the resistance element 24 in a vertical direction with respect to the surface of the substrate 10 is increased. Investment can therefore be suppressed with this embodiment because a new mask is not required.

Figure 2:
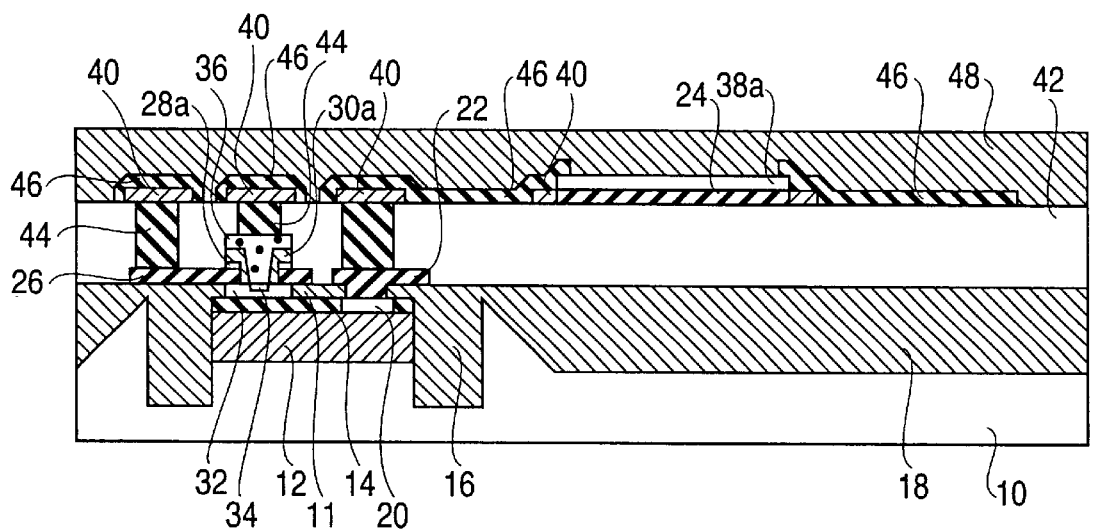
FIG. 2 is a view showing the cross-sectional structure of a semiconductor device of a second embodiment of the present invention.

FIG. 2 is a cross-sectional view showing the structure of a semiconductor device of a second embodiment of the present invention. The following is a description of the method of manufacturing a semiconductor device of a second embodiment of the present invention.

As with the first embodiment, a bipolar transistor that is the circuit element shown in the related art is formed on a p-type silicon substrate 10. Next, a silicon oxide film 42 is formed as the first insulation film on the bipolar transistor, the trench separation insulation film 16 and the field insulation film 18. A contact hole is then formed in the silicon oxide film 42 using photolithographic and etching processing. An interconnect plug 44 of, for example, tungsten is formed as the first high fusion point metal film at this contact hole. A TEG measurement pad (not shown) is also formed during formation of this interconnect plug 44 so that TEG measurements for monitoring the transistor can be made. After this, the transistor characteristics are measured using the TEG for monitoring the transistor, and a resistance that makes the output 203 of the circuit of FIG. 6 of a prescribed current or voltage is obtained. As with the first embodiment, a polysilicon film of a prescribed p-type impurity concentration and film thickness is formed on the silicon oxide film 42 including the interconnect plug 44 in such a manner as to give a prescribed sheet resistance.

In this second embodiment, after this, the resistance element 24 of a resistance set as described above using the polysilicon film is formed using photolithographic and etching processing. During this time, a polysilicon film is formed at the upper part of the interconnect plug 44 so as to cover the exposed surface of the interconnect plug 44. A silicon oxide film 38a is formed as the second insulation film on the silicon oxide film 42 including the polysilicon film that becomes the resistance element portion. A pattern for the silicon oxide film 38a covering just a prescribed portion of the resistance element 24 is then formed using photolithographic and etching processing. A Ti (titanium) film is then formed using sputtering techniques as the second high fusion point metal film on the silicon oxide film 42 including the exposed polysilicon film. The exposed surface of the polysilicon film not covered by the silicon oxide film 38a is then made into a silicide using heat treatment such as RTA (Rapid Thermal Annealling) at a temperature of approximately 700° C. As a result, a Ti silicide 40 is formed at the exposed polysilicon surface and the exposed polysilicon film is made to be of a low resistance. Unreacted Ti is then removed. The second high fusion point metal film is by no means limited to Ti, and other high fusion point metals such as Co (cobalt) etc. can also be used. Next, for example, an aluminum alloy film is formed as a metal film on the silicon oxide film 42 including the Ti silicide 40. Interconnect 46 is then formed using the aluminum alloy film using photolithographic and etching processing. An insulation film 48 is then formed as a protective film on the interconnect 46, silicon oxide film 38a and the silicon oxide film 42. This situation is shown in FIG. 2.

According to the method of this embodiment, a polysilicon pattern covering the exposed surface of the upper part of the interconnect plug 44 can be made into a silicide. The parts connecting the resistance element 24 and the interconnect 46 are also made into a silicide. The resistances of parts connecting the interconnect plug 44 and the polysilicon pattern, and the parts connecting the resistance element 24 and the interconnect 46 are therefore lower than in the related art. However, this has no influence on the setting of the impurity concentration of the resistance element 24 because the resistance element 24 is covered by the silicon oxide film 38a and there is no degeneration in the exposed surface of the upper part of the interconnect plug 44. The distance between the semiconductor substrate and the resistance element can be maintained, as in the first embodiment, and reductions in parasitic capacitance can again be obtained.

Figure 3:
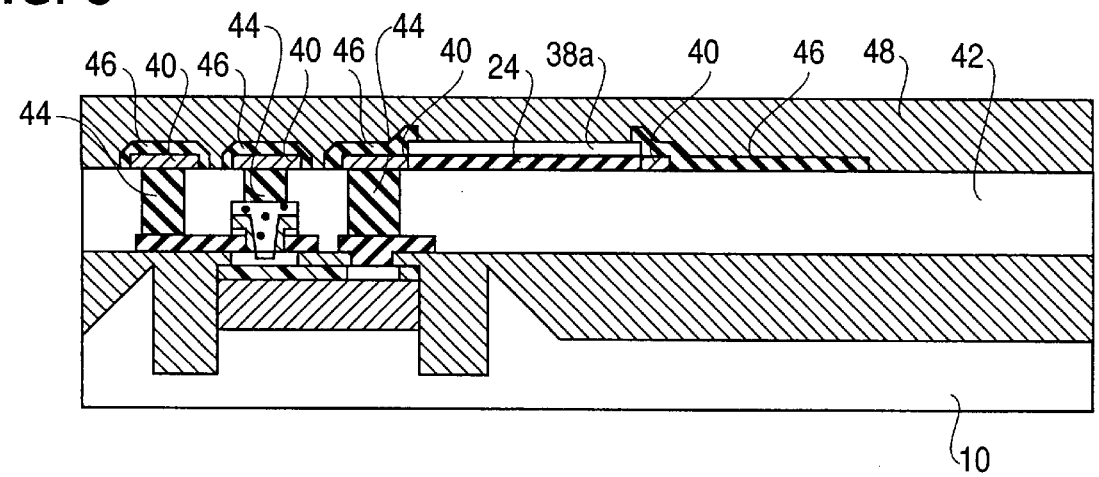
FIG. 3 is a view showing the cross-sectional structure of a semiconductor device of a third embodiment of the present invention.

FIG. 3 is a cross-sectional view showing the structure of a semiconductor device of a third embodiment of the present invention. Differences with the structure of the semiconductor device of the second embodiment of the present invention are as follows. In the second embodiment, interconnect 46 is formed at parts connecting the resistance element 24 and the collector lead-out electrode 22 but in this embodiment connecting parts that have been made into silicides can be formed at the upper part of the interconnect plug 44 at the resistance element 24.

According to the configuration of this embodiment, the length, in the direction of a horizontal plane, of the interconnect component connecting the interconnect plug 44 and the resistance element 24 can be made shorter by connecting the interconnect plug 44 and a Ti silicide part 40 of the polysilicon film. Parasitic capacitance between the p-type silicon substrate 10 and the interconnect 46 can therefore be reduced as a result of shortening the interconnect 46. The size of the element can therefore be reduced as a result of making the space for forming interconnect in the horizontal plane smaller than for the related art.

Figure 4:
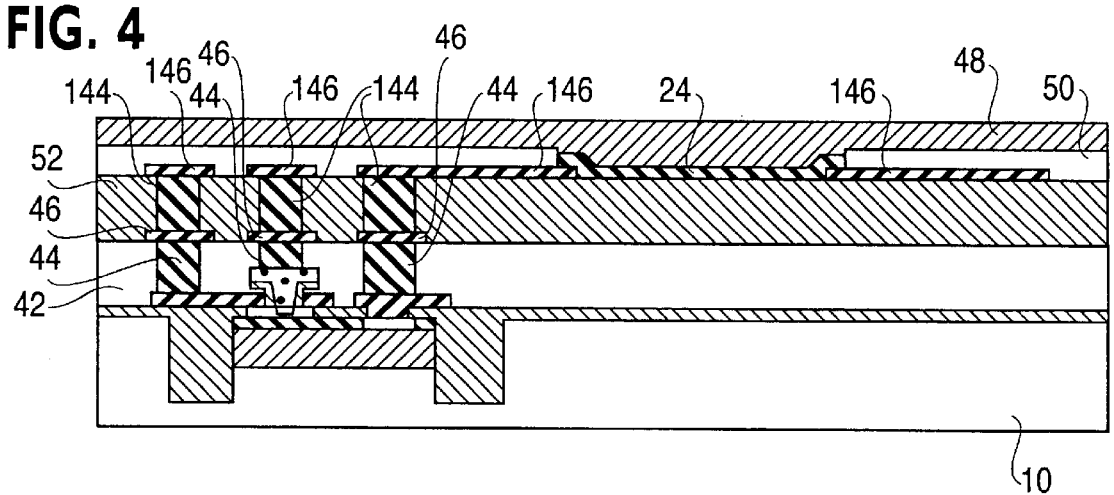
FIG. 4 is a view showing the cross-sectional structure of a semiconductor device of a fourth embodiment of the present invention.
Figure 5A:
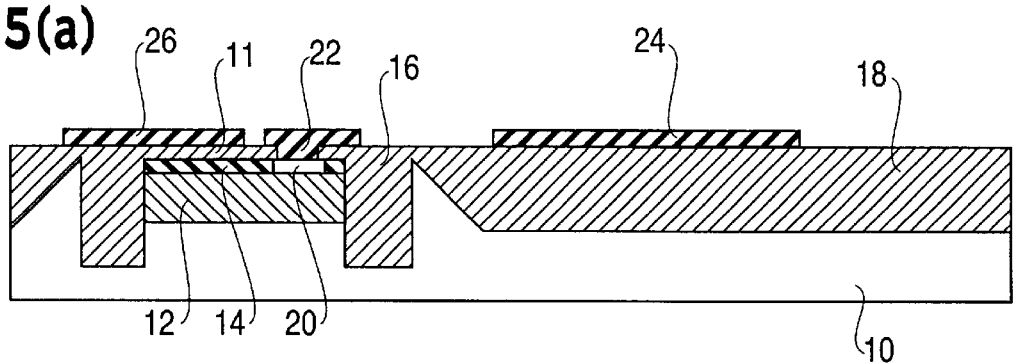
FIG. 5(a) through FIG. 5(d) are cross-sectional views showing the flow of a related method for manufacturing a semiconductor device.
Figure 5B:
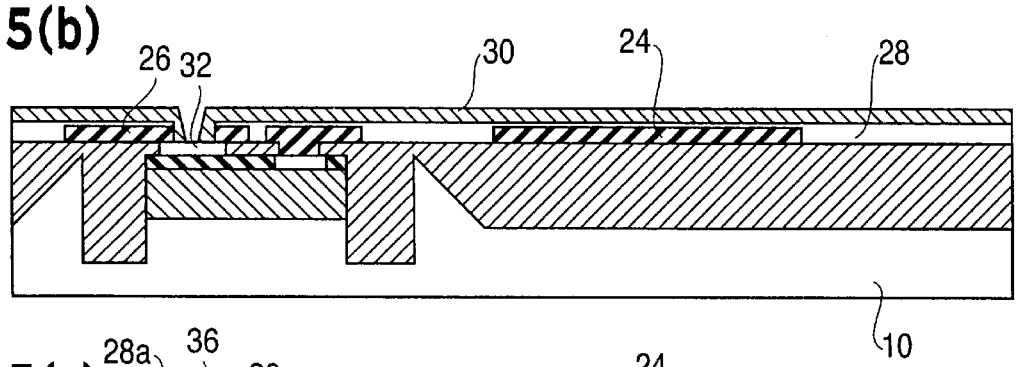
Figure 5C:
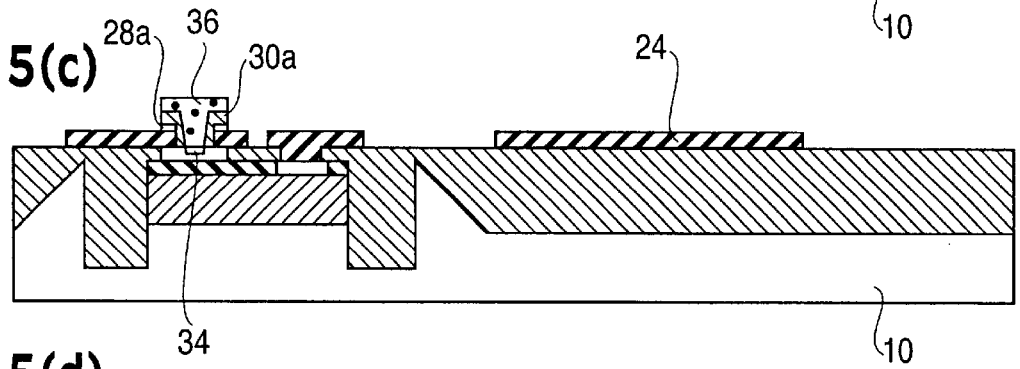
Figure 5D:
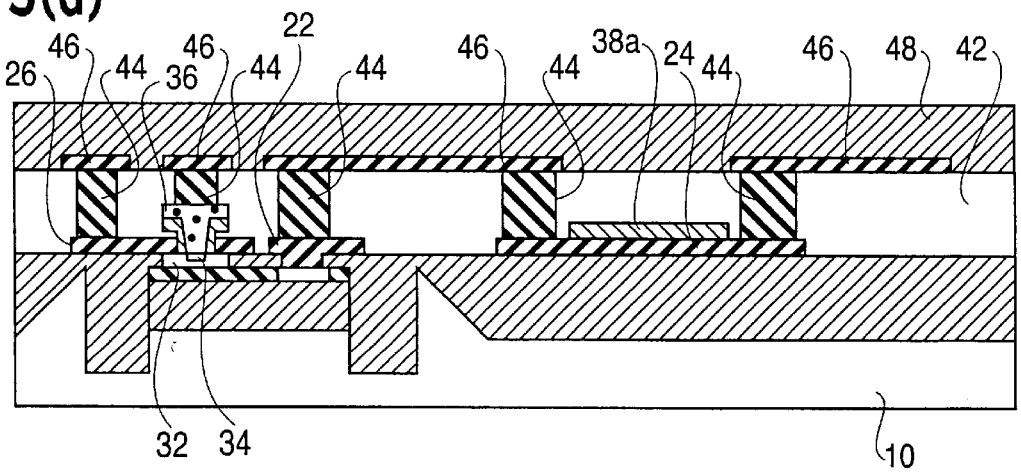

FIG. 4 is a cross-sectional view showing the structure of a semiconductor device of a fourth embodiment of the present invention. An example of a semiconductor device of a multi-layer interconnect structure is shown in FIG. 4. In this embodiment, the silicon oxide films 42 and 52 are layered on an oxide film formed on the surface of the p-type silicon substrate 10 and a resistance element 24 is formed on the silicon oxide film 52. The position of the resistance element 24 from the p-type silicon substrate 10 can be kept further away in the vertical direction with respect to the surface of the p-type silicon substrate 10. Parasitic capacitance between the interconnect 146 and the p-type silicon substrate 10 can therefore be reduced. As shown in FIG. 4, parasitic capacitance can be kept sufficiently small in this embodiment even if the field insulation film is not formed, although the field insulation film can still be formed. In addition to just the silicon oxide film 42 and the silicon oxide film 52, an insulation film can also be layered on top of these two films.

What is claimed is:

1. A semiconductor device comprising a transistor formed on a semiconductor substrate and a resistive element connected to the transistor, said semiconductor device further comprising:
   an insulating layer which is formed on a surface of the semiconductor substrate, wherein the insulating layer defines a region where the transistor is formed thereon; and
   an intermediate insulating layer which is formed on the transistor and the insulating layer;
   wherein the resistive element is formed on the intermediate insulating layer, wherein the resistive element is electrically connected to the transistor through a conductive material filled in a contact hole which is formed in the intermediate insulating layer.

2. The semiconductor device according to claim 1, further comprising a conductive line which is formed on the intermediate insulating layer, wherein the conductive line connects the resistive element with the conductive material.

3. The semiconductor device according to claim 2, wherein a first connecting portion between the conductive line and the resistive element is comprised of a reacted layer which is a combination of silicon and refractory metal.

4. The semiconductor device according to claim 3, wherein a second connecting portion between the conductive material and the conductive line is comprised of the reacted layer.

5. The semiconductor device according to claim 4, wherein the conductive material is comprised of tungsten, and wherein the resistive element is comprised of polycrystalline silicon.

6. The semiconductor device according to claim 2, wherein the conductive line is covered by a silicon nitride layer.

7. The semiconductor device according to claim 1, wherein a connecting portion between the resistive element and the conductive material is comprised of a layer which is a combination of silicon and refractory metal.

8. The semiconductor device according to claim 1, wherein the transistor includes a first electrode, a second electrode and a third electrode, wherein the first electrode is connected to the resistive element and an output terminal.

9. The semiconductor device according to claim 1, wherein the resistive element is located above the insulating layer.

10. A semiconductor device comprising a transistor formed on a semiconductor substrate and a resistive element connected to the transistor, said semiconductor device further comprising:
   a first intermediate insulating layer which is formed on the transistor; and
   a second intermediate insulating layer which is formed on the first intermediate insulating layer;
   wherein the resistive element is formed on the second intermediate insulating layer, wherein the resistive element is electrically connected to the transistor through a conductive material filled in a contact hole which is formed in the first and second intermediate insulating layers.

11. The semiconductor device according to claim 10, wherein the contact hole penetrates through the first and second intermediate insulating layers.

12. The semiconductor device according to claim 11, wherein the first and second intermediate insulating layers are comprised of silicon oxide.

13. A semiconductor device comprising a bipolar transistor having a first electrode, a second electrode and a third electrode, and an resistive element connected to the bipolar transistor, said semiconductor device further comprising:
   an intermediate insulating layer which is formed on the bipolar transistor, wherein the intermediate insulating layer includes a first contact hole and a second contact hole which are formed therein;
   wherein the resistive element is formed on the intermediate insulating layer, wherein the resistive element is connected to the first electrode through a first conductive layer which is filled in the first contact hole; and
   wherein the second electrode is connected to a first conductive pattern which is formed on the intermediate insulating layer through a second conductive layer which is filled in the second contact hole, wherein the first conductive pattern receives an input signal.

14. The semiconductor device according to claim 13, wherein the intermediate insulating layer includes a third contact hole, wherein the third electrode is connected to a second conductive pattern which is formed on the intermediate insulating layer through a third conductive layer which is filled in the third contact hole.

15. The semiconductor device according to claim 14, wherein the first, second and third conductive layers are comprised of refractory metal.

16. The semiconductor device according to claim 13, wherein the intermediate insulating layer is comprised of two silicon oxide layers.

17. A semiconductor device comprising a transistor formed on a semiconductor substrate, said semiconductor device further comprising:
   an insulating layer which is formed on the semiconductor substrate so as to define a region where the transistor is formed thereon;
   an intermediate insulating layer which is formed on the transistor and the insulating layer, wherein the intermediate insulating layer has a contact hole located on the transistor;
   a conductive material filled in the contact hole, wherein the conductive material is connected to the transistor;
   a resistive element which is formed on the intermediate insulating layer, wherein the resistive element is located above the insulating layer;
   a conductive line which is formed on the intermediate insulating layer so as to connect the conductive material with the resistive element.

18. The semiconductor device according to claim 17, wherein a first connecting portion between the conductive line and the resistive element is comprised of a reacted layer which is a combination of silicon and refractory metal.

19. The semiconductor device according to claim 18, wherein a second connecting portion between the conductive material and the conductive line is comprised of the reacted layer.

20. The semiconductor device according to claim 19, wherein the conductive material is comprised of tungsten, and wherein the resistive element is comprised of polycrystalline silicon.

21. The semiconductor device according to claim 20, wherein the conductive line is covered by a silicon nitride layer.

22. The semiconductor device according to claim 17, wherein a connecting portion between the resistive element and the conductive material is comprised of a layer which is a combination of silicon and refractory metal.

23. The semiconductor device according to claim 17, wherein the transistor includes a first electrode, a second electrode and a third electrode, wherein the first electrode is connected to the resistive element and an output terminal.

* * * * *